United States Patent [19]

Soloway

[11] 3,839,646

[45] Oct. 1, 1974

[54] FIELD EFFECT TRANSISTOR LOGIC GATE WITH IMPROVED NOISE MARGINS

[75] Inventor: Barry Howard Soloway, Allentown, Pa.

[73] Assignee: Bell Telephone Laboratories, Incorporated, Murry Hill, Berkeley Heights, N.J.

[22] Filed: Aug. 13, 1973

[21] Appl. No.: 387,935

[52] U.S. Cl. .................. 307/205, 307/214, 307/304

[51] Int. Cl. ....................... H03k 19/08, H03k 19/40

[58] Field of Search ........... 307/205, 214, 251, 254, 307/279, 304

[56] References Cited

UNITED STATES PATENTS

| | | | |
|---|---|---|---|
| 3,395,291 | 7/1968 | Bogert | 307/214 X |
| 3,395,292 | 7/1968 | Bogert | 307/304 X |
| 3,518,454 | 6/1970 | French | 307/304 X |
| 3,617,767 | 11/1971 | Booher | 307/251 X |
| 3,644,750 | 2/1972 | Campbell | 307/205 X |
| 3,651,342 | 3/1972 | Dingwall | 307/251 |
| 3,739,194 | 6/1973 | Freeman et al. | 307/214 |

FOREIGN PATENTS OR APPLICATIONS

| | | | |
|---|---|---|---|
| 918,757 | 1/1973 | Canada | 307/260 A |

*Primary Examiner*—Rudolph V. Rolinec
*Assistant Examiner*—L. N. Anagnos
*Attorney, Agent, or Firm*—Donnie E. Snedeker

[57] ABSTRACT

The noise margins of a standard field effect transistor logic gate circuit, connected between first and second logic potential terminals, are substantially unequal because the transition region between logic states typically occurs much closer to the more positive of the two potentials. Significant improvement is achieved by detaching the connection to the more positive terminal of the standard logic gate circuit and attaching it to the center tap of a second circuit, comprising a series connection of two additional field effect transistors. The second circuit, connected between the first and second potential terminals, forms a voltage divider and a continuous current path. The respective control electrodes of the two additional transistors are jointly connected to the less positive of the two terminals, causing one of the additional transistors to operate in its triode region and the other to operate in its saturation region. The transition region of the logic gate circuit is thereby narrowed and approximately centered between the two potentials.

8 Claims, 2 Drawing Figures

FIELD EFFECT TRANSISTOR LOGIC GATE WITH IMPROVED NOISE MARGINS

BACKGROUND OF THE INVENTION

This invention relates to logic gate circuits and, more particularly, to logic gate circuits employing field effect transistors (FETs).

Field effect transistors are used in many circuits to provide a wide variety of functions including logic gating and signal conversion. A typical FET logic gate circuit comprises a pair of FETs connected in series between logic one and logic zero potential terminals. Usually one FET serves as an input gate and the second FET as a load element with the logic gate output being taken from the common junction between the two FETs. The transition region of such prior art FET logic gate circuits is typically closer to the more positive logic potential. This characteristic provides little noise margin when the input signal on the control electrode of the input FET in at the more positive potential. Desirably, the noise margin of each logic state should be approximately equal, such as by approximately centering the transition region between the logic one and the logic zero potentials. However, even if centered, the width of the transition region in known gate circuits is usually sensitive to component variations occasioned during fabrication, which may also adversely affect the noise margin. Consequently, it would be desirable to both center the transition region and to narrow the width thereof.

Accordingly, it is an object of this invention to increase the noise margin of the logic state represented by the more positive potential in a logic gate circuit.

It is a further object of this invention to provide a logic gate circuit in which the logic one and logic zero noise margins are approximately equal.

It is still a further object of this invention to narrow the width of the transition region between the two logic states of a logic gate circuit.

A still further object of this invention is to provide a logic gate circuit which is substantially less sensitive to processing variations in component fabrication.

SUMMARY OF THE INVENTION

According to my invention, the above and other objects are achieved in a logic gate circuit, connected between logic one and logic zero potential terminals, by detaching the connection to the more positive of the two terminals and attaching it to the center tap of a second circuit. The second circuit comprises two FETs, serially connected between the two potential terminals and functions as a voltage divider and continuous current circuit. Since the center tap voltage is between the two terminal potentials, the transition region of the logic gate circuit is shifted toward the less positive potential, approximately centering the transition region between the logic one and logic zero potentials.

According to a further aspect of my invention, the respective control electrodes of the two FETs in the second circuit are jointly connected to the less positive potential terminal, causing one FET to operate in its triode region and the other FET to operate in its saturation region. The voltage provided at the center tap of the voltage divider is thereby made sensitive to variations in circuit threshold voltages such as those that typically arise during component fabrication. This sensitivity is such that the width of the transition region is thereby narrowed.

BRIEF DESCRIPTION OF THE DRAWING

My invention should become fully apparent when taken in connection with the following detailed description and the accompanying drawing in which.

DETAILED DESCRIPTION

Figure 1:
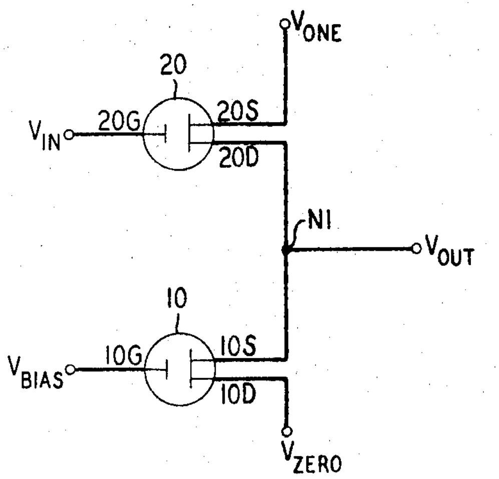
FIG. 1 (PRIOR ART)
FIG. 1 illustrates a typical prior art FET logic gate inverter circuit.

FIG. 1 shows a typical prior art logic gate inverter circuit comprising two FETs connected in series between logic one and logic zero potential terminals. For descriptive purposes herein the logic one potential is assumed to be greater, or more positive, than the logic zero potential. Drain electrode 10D of load element FET 10 is connected to logic zero terminal $V_{ZERO}$. Control electrode 10G is connected to bias voltage terminal $V_{BIAS}$. Source electrode 10S is connected jointly at node N1 to output terminal $V_{OUT}$ and drain electrode 20D of data input FET 20. Control electrode 20G is connected to input signal terminal $V_{IN}$. Source electrode 20S is connected to logic one terminal $V_{ONE}$.

Briefly, the circuit shown in FIG. 1 operates as follows. If the voltage supplied at $V_{IN}$ is the logic one potential, the voltage provided at $V_{OUT}$ approaches the logic zero potential. Conversely, if the voltage supplied at $V_{IN}$ is the logic zero potential, the voltage provided at $V_{OUT}$ approaches the logic one potential. When the voltage supplied at $V_{IN}$ is between the extremes represented by the logic one and logic zero potentials, the voltage provided at $V_{OUT}$ may be in a transition region.

More particularly, terminal $V_{BIAS}$ is usually connected to a potential source of such amplitude as to cause FET 10 to operate in its triode region and to be normally ON, or conducting. When the voltage supplied at $V_{IN}$ is the logic one potential, FET 20 is OFF, or not conducting. As the voltage supplied at $V_{IN}$ is reduced below the logic one potential and approaches the turn-on voltage of FET 20, FET 20 will begin to conduct. As the voltage supplied at $V_{IN}$ continues toward the logic zero potential, FET 20 will enter its triode region and become fully conducting so that the voltage provided at $V_{OUT}$ will approach the logic one potential. The final amplitude of the potential provided at $V_{OUT}$ is primarily dependent upon the ratio of the transconductance of FET 10 to that of FET 20.

The transition between logic states, as the voltage supplied at $V_{IN}$ moves from a logic one potential to the logic zero potential, usually occurs very close to the logic one potential; more especially, at about the magnitude of the threshold voltage below the logic one potential. The threshold voltage of field effect transistor is defined as the difference between the source electrode-to-drain electrode potential and the turn-on voltage, which latter voltage is the control electrode-to-drain electrode voltage required to create a conducting channel between the source and drain electrodes. The threshold voltage of an FET is typically a design parameter controllable at the time of fabrication. Typical state of the art threshold voltages are between 0.6 volts and 1.4 volts with variations dependent upon fabrication tolerances and application objectives. In a typical embodiment, wherein five volts is the logic one potential and ground is the logic zero potential, the resultant logic one noise margin is typically about 0.6 volts as compared to a logic zero noise margin of about 3.6 volts, with the width of the transition region being on the order of 0.8 volts, representing the difference between high and low threshold devices. Such a small logic one noise margin is inadequate in high noise environments such as are common in telephone plants. Logic circuits having approximately equal logic one and logic zero noise margins are desirable in such applications so as to provide stable operation.

Figure 2:
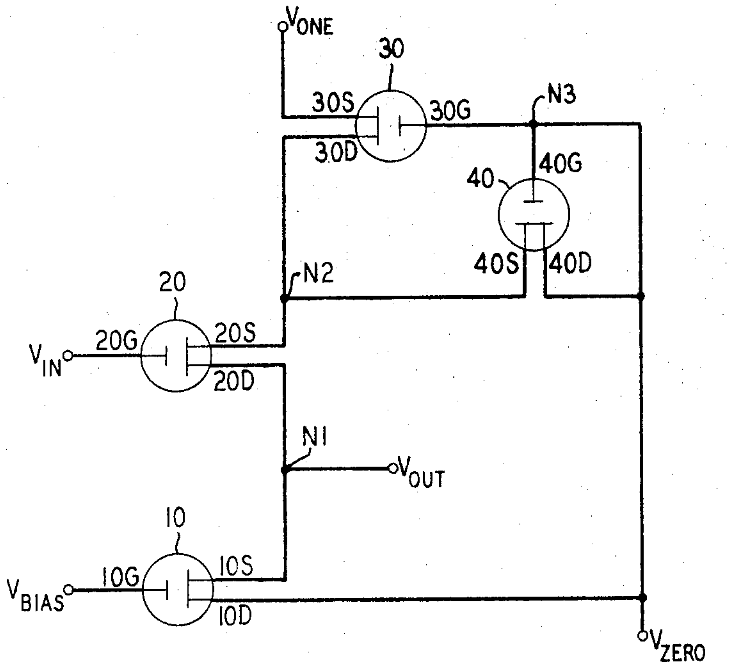
FIG. 2 illustrates an improved embodiment of the logic gate circuit of FIG. 1 modified in accordance with the principles of the present invention.

Approximate equality in noise margins is achieved in accordance with the present invention by adding a voltage divider and continuous current circuit comprising load elements FET 30 and FET 40 serially connected between terminals $V_{ONE}$ and $V_{ZERO}$, as shown in the illustrative logic gate embodiment in FIG. 2. Except for source electrode 20S of FET 20, FET 10 and FET 20 are connected in the same manner as discussed above for FIG. 1. Source electrode 20S is connected at the center tap, node N2, jointly to drain electrode 30D of FET 30 and to source electrode 40S of FET 40. Drain electrode 40D is connected to terminal $V_{ZERO}$ and source electrode 30S, to terminal $V_{ONE}$. Control electrodes 30G and 40G are jointly connected to terminal $V_{ZERO}$.

FET 10 and FET 20 in FIG. 2 operate functionally in substantially the same manner as described in connection with the FIG. 1 circuit. The series connection of FET 30 and FET 40 between terminals $V_{ONE}$ and $V_{ZERO}$ provides a voltage divider function at node N2. The lower potential at node N2 results in a shift in the logic gate transition region to a point approximately midway between the logic one and logic zero potentials. The logic one noise margin is thereby increased and the logic zero margin is decreased, resulting in substantially equal logic one and logic zero margins.

However, even though the transition region is centered, the width thereof may be sufficiently great due to fabrication tolerances so as to adversely affect the noise margins. In accordance with a further aspect of my invention, the effective width of the transition region is advantageously narrowed since the voltage at node N2 is sensitive to variations in FET threshold voltage. The voltage at node N2 is dependent primarily upon the ratio of the transconductance of FET 30 to that of FET 40. The transconductance of an FET is, in turn, typically dependent primarily upon the geometry of the FET and, particularly if the FET is operating in its saturation region, upon the threshold voltage of the FET. In the illustrative FIG. 2 embodiment, with control electrodes 30G and 40G connected to terminal $V_{ZERO}$, FET 30 operates in its triode region whereas FET 40 operates in its saturation region. An FET with a high threshold voltage, when operating in its saturation region, usually has a lower transconductance than does a similar device operating in its triode region. Thus the sensitivity of the voltage at node N2 to variations in threshold voltage is manifested as a perturbation of the voltage at node N2 such that a decrease in the threshold voltage of FET 40 causes an increase in the voltage across FET 30. Conversely, an increase in the threshold voltage of FET 40 causes a decrease in the voltage across FET 30. Thus, if the threshold voltage attendant to the fabrication of FET 40 is large, the voltage provided at node N2 is larger than it would have been had FET 40 had a smaller threshold voltage. The apparent effect of the larger threshold voltage is to partially counteract the voltage divider and thereby shift the high threshold voltage transition toward the logic one potential, typically in the order of 0.3 volts. The typical overall effect is exhibited as a reduction in transition region from about 0.8 volts to about 0.5 volts. Further, the net outcome is to incrementally lessen the decrease in the logic zero noise margin and to narrow the width of the transition region.

Although the invention has been described and illustrated in detail, it is to be understood that the same is by way of illustration and example only. It will be apparent from the description above that the present invention may be employed for improving noise margins in various other known FET logic circuit configurations connected between two logic potential terminals. Thus, the spirit and scope of the invention are limited only by the terms of the appended claims.

1. In a logic gate circuit of the type including a data input transistor and a load element connected in series between first and second potential terminals, and an output terminal connected to the common junction between said input transistor and said load element, the improvement comprising a second transistor connected in series between said input transistor and said first terminal, a third transistor connected in parallel with said input transistor and said load element between said second terminal and the common junction of said input and second transistors, and means for connecting respective control electrodes of said second and third transistors jointly to said second potential terminal.

2. In a logic gate circuit of the type including a data input field effect transistor and a load element field effect transistor connected in series between first and second potential terminals, and an output terminal connected to the common junction between said input transistor and said load element, the improvement comprising a second field effect transistor connected in series between said input transistor and said first terminal, a third field effect transistor connected in parallel with said input transistor and said load element between said second terminal and the common junction of said input and second transistors, means for operating said load element and second transistors each in its triode region, and means for operating said third transistor in its saturation region.

3. In combination:

a first and a second logic potential terminal for connection respectively to a first and a second potential, respectively representing complementary logic states, a third potential terminal, means connected to at least one of said first and second terminals for providing at said third terminal a substantially continuous potential having a predetermined value between said first and second potentials, an input transistor, a load element, means for serially connecting said input transistor and said load element between said second and third potential terminals, an output terminal, and means for connecting said output terminal to said input transistor.

4. The combination according to claim 3 wherein said providing means comprises potential divider means connected between said first and second potential terminals, said potential divider means having an intermediate potential tap, and means connecting said third potential terminal to said intermediate potential tap of said potential divider means.

5. The combination according to claim 3 further comprising:

a first and a second load, each having at least two terminals, means for connecting one terminal of said first load to said first potential terminal, means for connecting one terminal of said second load to said second potential terminal, means for jointly connecting said other terminal of said first and second loads, and means for connecting said third potential terminal to said joint connection of said first and second loads.

6. The combination according to claim 5 wherein said first and second loads each comprise a field effect transistor, said combination further comprising:

means for operating said first load transistor in its triode region, and means for operating said second load transistor in its saturation region.

7. The combination according to claim 5 wherein said first and second loads each comprise a field effect transistor, said combination further comprising:

means for connecting a control electrode of said first load transistor to said second potential terminal, and means for connecting a control electrode of said second load transistor to said second potential terminal.

8. In a logic gate circuit of the type having a pair of serially connected transistors interconnected between first and second potential terminals, input means connected to one of said transistors, and output means connected between said pair of transistors, the improvement comprising a third potential terminal; means for connecting said pair of transistors to said first potential terminal through said third potential terminal; said connecting means including two additional transistors, means connecting said two additional transistors in series between said first and second potential terminals, said third potential terminal connected between said additional transistors, means connecting said pair of transistors to said third potential terminal; and means for jointly connecting respective control electrodes of said two additional transistors to said second potential terminal.

* * * * *

UNITED STATES PATENT OFFICE
CERTIFICATE OF CORRECTION

Patent No. 3,839,646 Dated October 1, 1974

Inventor(s) Barry H. Soloway

It is certified that error appears in the above-identified patent and that said Letters Patent are hereby corrected as shown below:

Column 1, line 20, "in" should read --is--.

Column 2, line 58, after "of" and before "field" insert --a--.

Column 4, after line 20 and before line 21 insert --I claim:--.

Signed and sealed this 3rd day of December 1974.

(SEAL)
Attest:

McCOY M. GIBSON JR.
Attesting Officer

C. MARSHALL DANN
Commissioner of Patents